United States Patent [19]

Maeda et al.

[11] Patent Number: 5,026,788
[45] Date of Patent: Jun. 25, 1991

[54] PHOTOSENSITIVE POLYMER HAVING THIOL GROUP

[75] Inventors: Hirotoshi Maeda, Yokohama; Kouichi Kunimune, Ichihara, both of Japan

[73] Assignee: Chisso Corporation, Osaka, Japan

[21] Appl. No.: 360,873

[22] Filed: Jun. 2, 1989

[30] Foreign Application Priority Data

Jun. 20, 1988 [JP] Japan ................................ 63-151664

[51] Int. Cl.$^5$ ...................... C08F 283/04; C08L 77/06
[52] U.S. Cl. .................................. 525/420; 525/421; 525/426; 525/436
[58] Field of Search ................ 525/421, 426, 436, 420

[56] References Cited

U.S. PATENT DOCUMENTS 4,645,823  2/1987  Ai et al. .............................. 528/353
4,694,061  9/1987  Pfeifer ................................ 528/128

FOREIGN PATENT DOCUMENTS 56-24343  3/1981  Japan .

Primary Examiner—John Kight, III
Assistant Examiner—P. Hampton-Hightower
Attorney, Agent, or Firm—Fred Philpitt

[57] ABSTRACT

Disclosed are a novel photosensitive poly(amide)imide precursor capable of being manufactured easily, having excellent shelf stability and high sensitivity, and containing less impurities, a process for manufacturing the above-mentioned precursor, a photosensitive polymer composition containing the precursor, and a process for forming a patterned poly(amide)imide film by the use of the photosensitive polymer composition.

The photosensitive polymer has an inherent viscosity of 0.1 to 5 dl/g and contains a repeating unit represented by the following general formula (I),

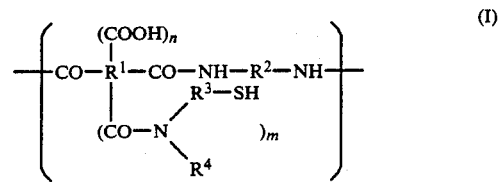

wherein $R^1$ is a trivalent or tetravalent carbon cyclic aromatic group or hetrocyclic group; $R^2$ is an aliphatic group having at least 2 carbon atoms, an alicyclic group, an aromatic aliphatic group, a carbon cyclic aromatic group, a heterocyclic group or a polysiloxane group; $R^3$ is a divalent organic group; $R^4$ is $-R^3-SH$, a hydrogen atom or a monovalent organic group; m is independently 1 or 2; n is independently 0 or 1; and m and n satisfy $1 \leq m+n \leq 2$.

2 Claims, 2 Drawing Sheets

PHOTOSENSITIVE POLYMER HAVING THIOL GROUP

BACKGROUND OF THE INVENTION (1) Field of the Invention

The present invention relates to a photosensitive heat-resistant polymer and a process for manufacturing the same. More particularly, the present invention relates to a novel photosensitive poly(amide)imide precursor having excellent shelf stability and high sensitivity, a process for manufacturing the precursor, a photosensitive polymer composition containing the precursor, and a process for forming a patterned poly(amide)imide film by the use of the composition.

(2) Description of the Prior Art

As heat-resistant photosensitive materials, photosensitive polyimides are widely used as raw materials for insulating films of semiconductors and for passivation films. For example, in Japanese Patent Laid-open Publication No. 145794/1979, a method is suggested in which a compound containing a double bond and an amino group or its quaternary salt is mixed with polyamic acid. Furthermore, in Japanese Patent Laid-open Publication Nos. 45746/1980 and 100143/1985, other methods are suggested in which an unsaturated epoxy compound or an isocyanate compound having a double bond is reacted with the carboxyl group of each polyamic acid. Japanese Patent Publication No. 41422/1980 discloses a polymer in which an active functional group such as a double bond is introduced into the ester side chain of polyamic acid. In addition, Japanese Patent Laid-open Publication No. 6729/1985 discloses a method for synthesizing a polyimide by the use of a diamine having a double bond which has been previously synthesized.

The method described in Japanese Patent Laid-open Publication No. 145794/1979 mentioned above has the drawback that since a great deal of the compound containing the amino group or its quaternary salt is added to the unstable polyamic acid solution, the viscosity of the solution changes noticeably with time. The techniques in Japanese Patent Laid-open Publication Nos. 45746/1980 and 100143/1985 have the drawback that when the compound having the unsaturated group is reacted with the carboxyl group of the polyamic acid, the viscosity of the solution changes owing to the partial decomposition of the polyamic acid and the like. Furthermore, in Japanese Patent Publication Nos. 41422/1980 and 6729/1985, the process for the introduction of the functional group is complicated, and much cost is required.

As understood from the foregoing, the conventional techniques have a variety of the problems, and so it is demanded to develop photosensitive materials without such problems.

SUMMARY OF THE INVENTION

An object of the present invention is to provide a novel photosensitive poly(amide)imide precursor capable of being manufactured easily, having excellent shelf stability and high sensitivity, and containing less impurities, a process for manufacturing the above-mentioned precursor, a photosensitive polymer composition containing the precursor, and a process for forming a patterned poly(amide)imide film by the use of the precursor.

The present invention is directed to a photosensitive polymer having an inherent viscosity of 0.1 to 5 dl/g when measured in a solvent at a temperature of $30° \pm 0.01°$ C. at a concentration of 0.5 g/dl, containing a repeating unit represented by the following general formula (I), and containing or not containing a repeating unit represented by the following general formula (II):

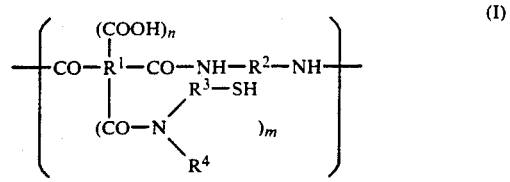

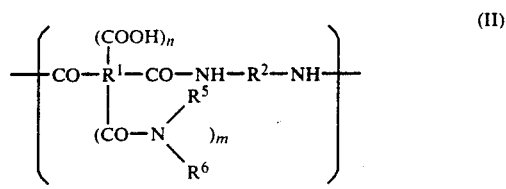

wherein $R^1$ is independently a trivalent or tetravalent carbon cyclic aromatic group or hetrocyclic group; $R^2$ is independently an aliphatic group having at least 2 carbon atoms, an alicyclic group, an aromatic aliphatic group, a carbon cyclic aromatic group, a heterocyclic group or a polysiloxane group; $R^3$ is a divalent organic group; $R^4$ is $—R^3—SH$, a hydrogen atom or a monovalent organic group; $R^5$ is a monovalent organic group having a photosensitive unsaturated group; $R^6$ is a hydrogen atom or a monovalent organic group; m is independently 1 or 2; n is independently 0 or 1; and m and n satisfy $1 \leq m + n \leq 2$.

The photosensitive polymer of the present invention can be prepared by reacting a poly(amide)isoimide containing either or both of a repeating unit represented by the general formula (III) and a repeating unit represented by the general formula (IV) with an amine containing a thiol group represented by the general formula (V) and, if necessary, an amine containing a photosensitive unsaturated group represented by the general formula (VI) at a temperature of 0° to 100° C.:

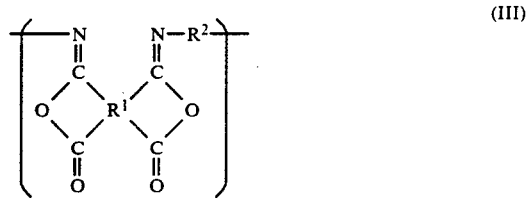

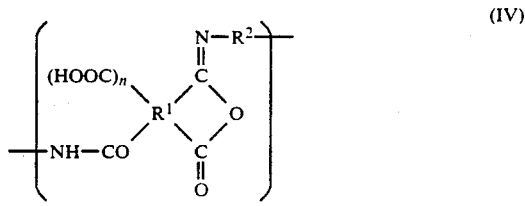

  (VI)

wherein $R^1$, $R^2$, $R^3$, $R^4$, $R^5$, $R^6$ and n are as defined above.

This photosensitive polymer can be utilized in a photosensitive polymer composition comprising the undermentioned components (a), (b), (c) and (d) and a solvent:

(a) The above-mentioned photosensitive polymer, (b) a photopolymerization initiator or a sensitizer in an amount of 0 to 20% by weight based on the above-mentioned photosensitive polymer, (c) a diazide compound in an amount of 0 to 50% by weight based on the photosensitive polymer, and (d) a compound having a carbon-carbon double bond in an amount of 0 to 10% by weight based on the photosensitive polymer.

Furthermore, this photosensitive polymer composition can be utilized to prepare a patterned poly(amide)imide film. That is, the above-mentioned composition is first applied onto a substrate, and it is then prebaked at a temperature of 30° to 150° C. Afterward, the applied composition is irradiated with chemical rays through a mask, followed by developing, rinsing and drying in this order. The composition is then postbaked at a temperature of 200° to 500° C., thereby obtaining the desired patterned poly(amide)imide coating film.

A BRIEF DESCRIPTION OF THE DRAWINGS

DETAILED DESCRIPTION OF THE INVENTION

Figure 1:
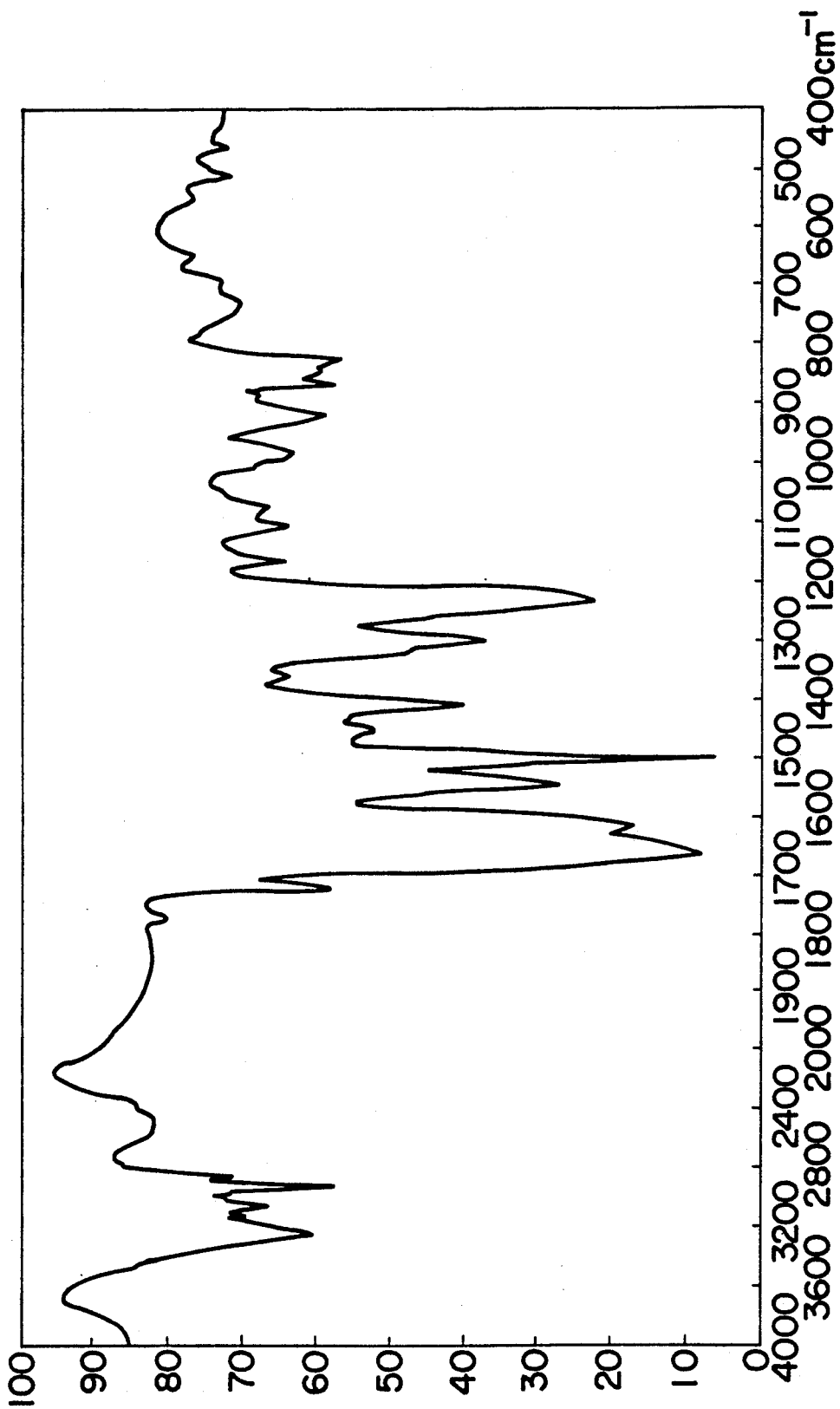
FIG. 1 is the infrared absorption spectrum of the polymer of example 1 with an inherent viscosity of 1.35 dl/g in NMP. The absorption was based upon a thiol group, present in the vicinity of 2,500 cm$^{-1}$ and the strong absorption based on an amido group and an allyl group present in the range of 1,600 to 1,700 cm$^{-1}$.

A photosensitive polymer of the present invention having the repeating unit represented by the general formula (I) and, if necessary, the repeating unit represented by the general formula (II) is a photosensitive polyamide-imide precursor in the case that in the formula (I), m=1 and n=0, or a photosensitive polyimide precursor in the case that m=1 and n=1 and in the case that m=2 and n=0, provided that the polymer of the present invention consists of the repeating unit or units represented by the general formula (I) or (I) and (II). The photosensitive polymer of the present invention can be prepared by reacting a poly(amide)isoimide containing either or both of a repeating unit represented by the general formula (III) and a repeating unit represented by the general formula (IV) with an amine containing a thiol group represented by the general formula (V) and, if necessary, an amine containing photosensitive unsaturated group represented by the general formula (VI) at a temperature of 0° to 100° C. for 0.2 to 30 hours in the presence of a solvent.

The above-mentioned poly(amide)isoimide can be easily prepared by treating a reaction product obtained by reacting either or both of a tetracarboxylic dianhydride and a tricarboxylic anhydride or its derivative with a diamine, in accordance with a process described on page 631 of "Proceedings of Second International Conference on Polyimides" (1985). The tetracarboxylic dianhydride, the tricarboxylic anhydride or its derivative and the diamine can be represented by the following formulae (VII),(VIII) and (IX):

  (VII)

  (VIII)

$$NH_2-R^2-NH_2 \quad (IX)$$

These compounds will be described in detail.

When $R^1$ is a carbon cyclic aromatic group, this group $R^1$ preferably has at least one six-membered ring. In particular, $R^1$ is a polycyclic aromatic group having a monocyclic aromatic group, a condensed polycyclic aromatic group or several condensed rings or non-condensed rings (these rings are combined with each other directly or via a crosslinking group).

Suitable examples of the crosslinking group are as follows:

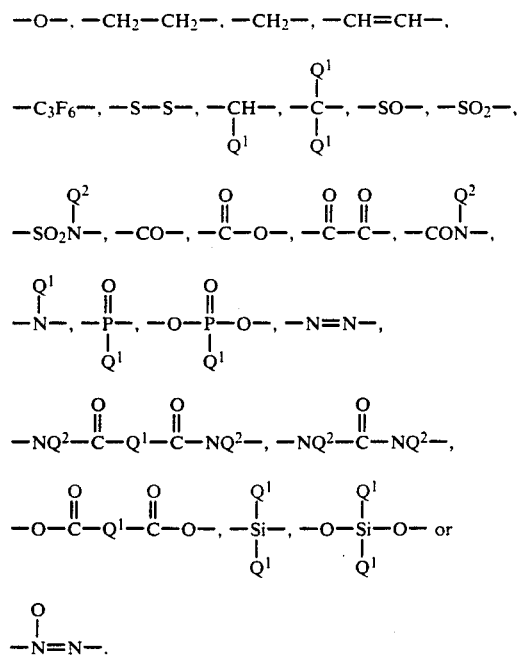

In the above-mentioned formulae, $Q^1$ is an alkyl group or an alkylene group substituted by one or more halogen atoms (preferably fluorine atoms) and having 1 to 6 carbon atoms, preferably 1 to 4 carbon atoms, or $Q^1$ is a cycloalkyl group, an aryl group or an arylene group.

$Q^2$ is a hydrogen atom, a cycloalkyl group, an aryl group or an alkyl group substituted by one or more halogen atoms and having 1 to 4 carbon atoms.

Furthermore, each of $Q^1$ and $Q^2$ may be a group comprising the above-mentioned groups which are combined with the interposition of two crosslinking groups, e.g., two $-SO_2-$ groups.

In the case that $R^1$ is a heterocyclic group, an example of the heterocyclic group is a heterocyclic aromatic group of a five-membered or a six-membered ring containing oxygen, nitrogen and/or sulfur, or a condensed cyclic group of the above-mentioned heterocyclic aromatic group and a benzene nucleus.

The carbon cyclic aromatic group or the heterocyclic group which $R^1$ represents may be substituted by, for example, one or more of a nitro group, an alkyl group having 1 to 4 carbon atoms, a trifluoromethyl group, a halogen atom (particularly a fluorine atom), a silyl group or a sulfamoyl group.

The group which $R^1$ represents may not be substituted or may be substituted by, for example, one or more of a halogen atom (e.g., fluorine, chlorine or bromine), or an alkyl group or an alkoxy group having 1 to 4 carbon atoms.

In the case that $R^2$ is a carbon cyclic aromatic group, a preferable example of the carbon cyclic aromatic group is a monocyclic aromatic group, a condensed polycyclic aromatic group or a non-condensed dicyclic aromatic group. In the case of this non-condensed dicyclic aromatic group, the aromatic rings are combined with each other via a cross-linking group. Examples of the crosslinking group are the same as recited in the description regarding $R^1$.

In the case that $R^2$ is a hetercyclic group, an example of the heterocyclic group is particularly a heterocyclic aromatic group of a five-membered or a six-membered ring containing oxygen, nitrogen and/or sulfur.

In the case that $R^2$ is an aliphatic group, an example of the aliphatic group is particularly an alkylene group having 2 to 12 carbon atoms, or another alkylene group in which a heteroatom such as oxygen, sulfur or nitrogen is present in the alkylene chain.

In the case that $R^2$ is an alicyclic group, an example of the alicyclic group is a cyclohexyl group or a dicyclohexylmethane, group. Moreover, in the case that $R^2$ is an aromatic aliphatic group, an example of the aromatic aliphatic group is particularly a 1,3-, 1,4- or 2,4-bis-alkylene benzene group, a 4,4'-bis-alkylene-diphenyl group or a 4,4'-bis-alkylene-diphenyl ether group.

With regard to $R^1$, it is preferred that each $R_1$ is independently a non-substituted monocyclic aromatic group, a non-substituted condensed polycyclic aromatic group or a non-substituted non-condensed dicyclic aromatic group. In the case of this non-substituted non-condensed dicyclic aromatic group, the aromatic rings are combined with each other via a crosslinking group such as $-O-$ or $-CO-$.

On the other hand, with regard to $R^2$, it is preferred that each $R^2$ is independently a monocyclic aromatic group or a non-condensed dicyclic aromatic group substituted by one or more halogen atoms or one or more alkyl groups or alkoxy groups each having 1 to 4 carbon atoms, or a non-substituted monocyclic aromatic aliphatic group or a non-substituted aliphatic group having 2 to 10 carbon atoms.

In the case that $R^2$ is a polysiloxane group, this group can be represented by the formula

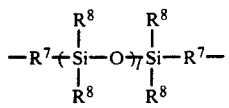

wherein $R^7$ is independently $-(CH_2)_s-$,

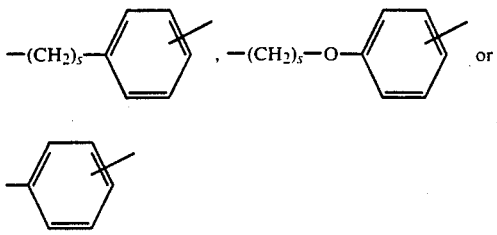

wherein s is an integer of 1 to 4, $R_8$ is independently an alkyl group having 1 to 6 carbon atoms, a phenyl group or an alkyl-substituted phenyl group having 7 to 12 carbon atoms, l is a value of $1 \leq l \leq 100$.

Exemplary compounds of the tetracarboxylic dianhydride represented by the above-mentioned formula (VII) are as follows:
Pyromellitic dianhydride,
3,3',4,4'-benzophenone-tetracarboxylic dianhydride,
2,3,3',4'-benzophenone-tetracarboxylic dianhydride,
2,2',3,3'-benzophenone-tetracarboxylic dianhydride,
3,3',4,4'-diphenyl-tetracarboxylic dianhydride,
2,2',3,3'-diphenyl-tetracarboxylic dianhydride,
bis(2,3-dicarboxyphenyl)-methane dianhydride,
bis(3,4-dicarboxyphenyl)-methane dianhydride,
2,2-bis(2,3-dicarboxyphenyl)-propane dianhydride
bis(3,4-dicarboxyphenyl)-ether dianhydride,
bis(3,4-dicarboxyphenyl)-sulfone dianhydride,
N,N-(3,4-dicarboxyphenyl)-N-methylamine dianhydride,
3,3',4,4'-tetracarboxybenzoyloxybenzene dianhydride,
2,3,6,7-naphthalene-tetracarboxylic dianhydride,
1,2,5,6-naphthalene-tetracarboxylic dianhydride,
thiophene-2,3,4,5-tetracarboxylic dianhydride,
pyrazine-2,3,5,6-tetracarboxylic dianhydride,
pyridine-2,3,5,6-tetracarboxylic dianhydride,
2,3,3',4'-biphenyltetracarboxylic dianhydride, and
2,2-bis(3,4-dicarboxyphenyl)hexafluoropropane.

In the general formula (VIII), X is Cl or OA wherein A is a hydrogen atom, an alkyl group having 1 to 5 carbon atoms, an aryl group, or an atom or group capable of making a salt with a carboxylic acid, for example, an alkaline metal atom, an ammonium group or a group of a tertiary base.

Examples of the tricarboxylic anhydride represented by the general formula (VIII) or its derivative include trimellitic anhydride, trimellitic anyhdride chloride, a sodium salt and ammonium salt of trimellitic anhydride, monomethyl ester, monoethyl ester, monoisopropyl ester, mono-sec-butyl ester, mono-tert-butyl ester and monoisopentyl ester of trimellitic anhydride, and phenol ester of trimellitic anhydride. Above all, trimellitic anhydride and trimellitic anyhdride chloride are particularly preferable.

As the diamines represented by the above-mentioned formula (IX), known compounds are used.

Exemplary compounds of the carbon cyclic aromatic diamines are particularly as follows:

o-, m- and p-Phenylenediamine, diaminotoluenes (e.g., 2,4-diaminotoluene), 1,4-diamino-2-methoxybenzene, 2,5-diaminoxylenes, 1,3-diamino-4-chlorobenzene, 1,4-diamino-2,5-dichlorobenzene, 1,4-diamino-2-bromobenzene, 1,3-diamino-4-isopropylbenzene, N,N'-diphenyl-1,4-phenylenediamine, 4,4'-diaminodiphenyl-2,2-propane, 4,4'-diaminodiphenylmethane, 2,2'-diaminostilbene, 4,4'-diaminostilbene, 4,4'-diamino diphenyl ether, 4,4'-diamino diphenyl thio-ether 4,4'-diaminodiphenylsulfone, 3,3'-diaminodiphenylsulfone, 4,4'-diaminobenzoic phenyl ester, 2,2'-diaminobenzophenone, 4,4'-diaminobenzophenone, 4,4'-diaminobenzil, 4-(4'-aminophenylcarbamoyl)-aniline, bis(4-aminophenyl)-phosphine oxide, bis(4-aminophenyl)-methyl-phosphine oxide, bis(3-aminophenyl)-methylsulfine oxide, bis(4-aminophenyl)-phenylphosphine oxide, bis(4-aminophenyl)-cyclohexylphosphine oxide, N,N-bis(4-aminophenyl)-N-phenylamine, N,N-bis(4-aminophenyl)-N-methylamine, 4,4'-diaminodiphenyl urea, 1,8-diaminonaphthalene, 1,5-diaminonaphthalene, 1,5-diaminoanthraquinone, diaminofluoranthene, bis(4-aminophenyl)-diethylsilane, bis(4-aminophenyl)-dimethylsilane, bis(4-aminophenyl)-tetramethyldisiloane, 3,4'-diaminodiphenyl ether, benzidine, 2,2'-dimethylbenzidine, 2,2-bis[4-(4-aminophenoxy)phenyl]propane, bis[4-(4-aminophenoxy)phenyl]-sulfone, 4,4'-bis(4-aminophenoxy)biphenyl, 2,2-bis[4-(4-aminophenoxy)phenyl]hexafluoropropane, 1,4-bis(4-aminophenoxy)benzene and 1,3-bis(4-aminophenoxy)-benzene.

Exemplary compounds of the heterocyclic diamines are as follows:

2,6-Diaminopyridine, 2,4-diaminopyrimidine, 2,4-diamino-s-triazine, 2,7-diamino-dibenzofuran, 2,7-diaminocarbazole, 3,7-diaminophenothiazine, 2,5-diamino-1,3,4-thiadiazole, 2,4-diamino-6-phenyl-s-triazine.

Furthermore, exemplary compounds of the aliphatic diamine are as follows:

Trimethylenediamine, tetramethylenediamine, hexamethylenediamine, heptamethylenediamine, octamethylenediamine, nonamethylenediamine, decamethylenediamine, 2,2-dimethylpropylenediamine, 2,5-dimethylhexamethylenediamine, 2,5-dimethylheptamethylenediamine, 4,4-dimethylheptamethylenediamine, 3-methylheptamethylenediamine, 3-methoxyheptamethylenediamine, 5-methylnonamethylenediamine, 2,11-daminododecane, 1,12-diaminooctadecane, 1,2-bis(3-aminopropoxy)-ethane, N,N'-dimethyl-ethylenediamine, N,N'-diethyl-1,3-diaminopropane, N,N'-dimethyl-1,6-diaminohexane and a diamine represented by the formula $H_2N(CH_2)_3O(CH_2)_2O(CH_2)_3NH_2$.

Suitable exemplary compounds of the alicyclic diamine include 1,4-diaminocyclohexane and 4,4'-diamino-dicyclohexylmethane, and suitable exemplary compounds of the aromatic aliphatic diamine include 1,4-bis(2-methyl-4-aminopentyl)-benzene, 1,4-bis(1,1-dimethyl-5-aminopentyl)-benzene, 1,3-bis(aminomethyl)-benzene and 1,4-bis(aminomethyl)-benzene.

Moreover, exemplary compounds of the diaminopolysiloxane are as follows:

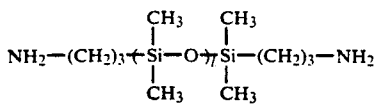

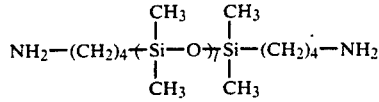

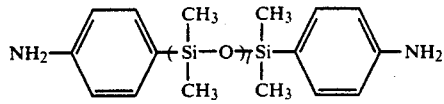

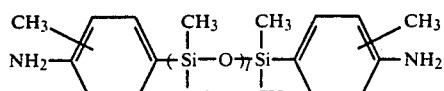

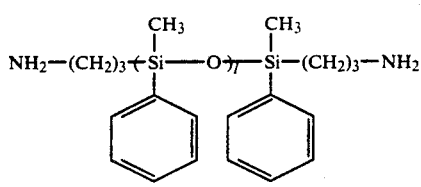

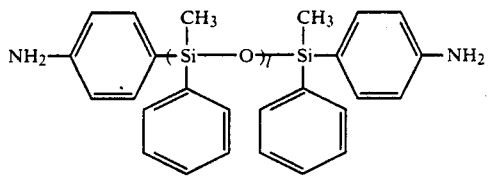

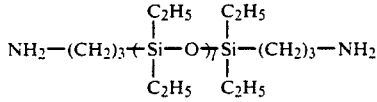

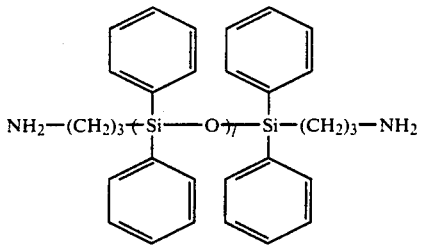

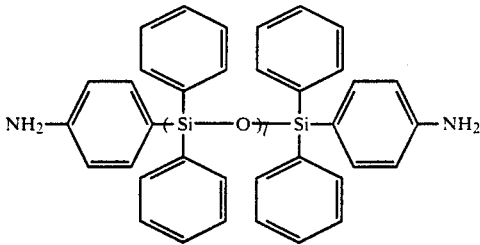

Reference will be made to the amine having a thiol group represented by the general formula (V).

$R^3$ in the general formula (V) is preferably a divalent organic group having 1 to 20 carbon atoms, or a residual group scuh as an aliphatic group, an alicyclic group, an aromatic group or aromatic aliphatic group. The group $R^3$ may have an unsaturated bond or a hydroxyl group, a carboxyl group or a polar group such as an ether moiety, an ester moiety or a ketone moiety. $R^4$ in the general formula (V) is preferably —$R^3$—SH, a hydrogen atom, an aliphatic group having 1 to 20 carbon atoms, an alicyclic group, an aromatic group or an aromatic aliphatic group. Similarly, the group $R^4$ may have an unsaturated bond or a hydroxyl group, a carboxyl group or a polar group such as an ether moiety, an ester moiety or a ketone moiety.

Examples of the compound represented by the general formula (V) include the following compounds:

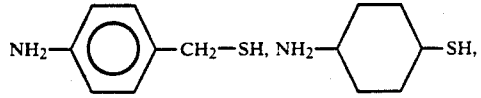

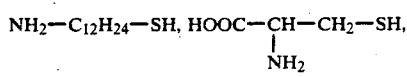

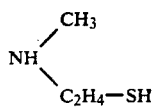

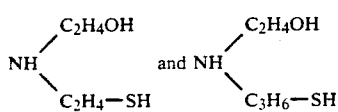

Reference will be made to the amine containing the photosensitive unsaturated group represented by the general formula (VI).

Examples of $R^5$ are as follows:

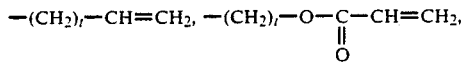

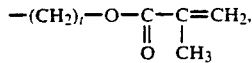

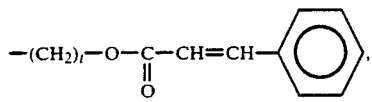

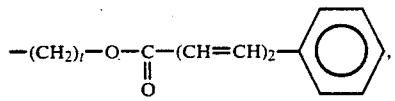

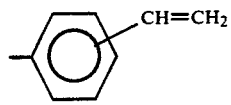

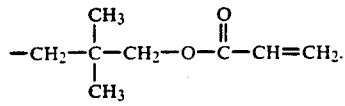

wherein t is a value of 1, 2 or 3.

Examples of $R^6$ include $R^5$, hydrogen atom, an aliphatic group having 1 to 20 carbon atoms, an alicyclic group, an aromatic group or an aromatic alphatic group. The group $R^6$ may have a hydroxyl group, a carboxyl group or a polar group such as an ether moiety, an ester moiety or a ketone moiety.

Exemplary compounds of the amine represented by the general formula (VI) are as follows:

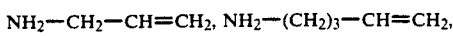

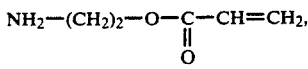

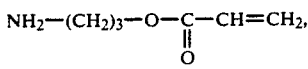

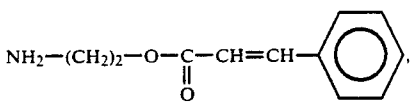

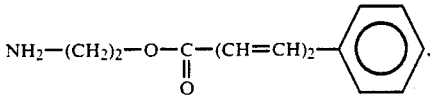

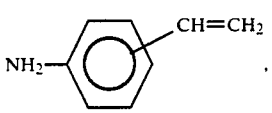

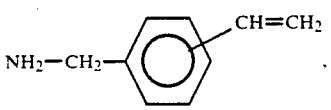

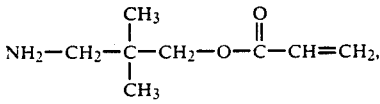

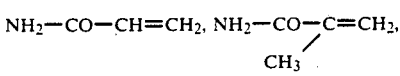

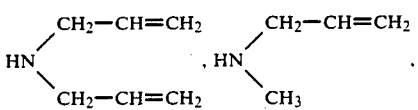

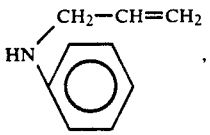

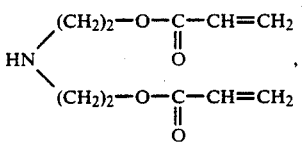

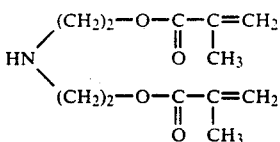

-continued

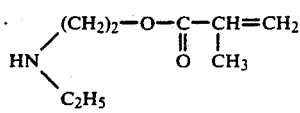

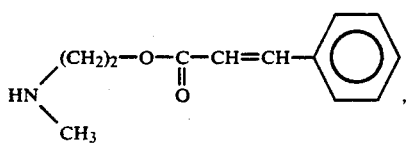

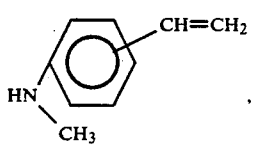

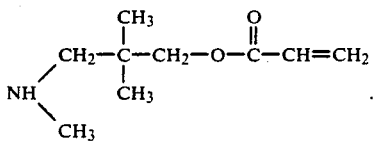

Preferable examples of the solvent (hereinafter referred to as "reaction solvent" at times) for the preparation of the photosensitive polymer of the present invention are as follows:

N-methyl-2-pyrrolidone, N,N-dimethylacetamide, N,N-dimethylformamide, dimethylsulfoxide, tetramethyl urea, pyridine, dimethylsulfone, hexamethylphosphoramide, methylformamide, N-acetyl-2-pyrrolidone, ethylene glycol monomethyl ether, ethylene glycol monoethyl ether, ethylene glycol monobutyl ether, diethylene glycol monomethyl ether, diethylene glycol dimethyl ether, cyclopentanone, cyclohexanone, cresol, γ-bulyrolactone, N,N-diethylacetamide, N,N-diethylformamide, N,N-dimethylemethoxyacetamide, tetrahydrofuran, N-acetyl-2-pyrrolidone, N-methyl-ε-caprolactam and tetrahydrothiophene dioxide (sulpholane).

Furthermore, the reaction for the preparation of the photosensitive polymer can be performed in a mixed solvent obtained by mixing two or more kinds of the above-mentioned organic solvents. In addition, the above-mentioned organic solvent, when used, can be diluted with, for example, another aprotic (neutral) organic solvent such as an aromatic, alicyclic or aliphatic hydrocarbon or its chlorinated derivative (e.g, benzene, toluene, xylenes, cyclohexane, pentane, hexane, petroleum ether or methylene chloride) or dioxane.

A poly(amide)amic acid can be synthesized from the above-mentioned acid anhydride and diamine in accordance with a known process in the presence of the aforesaid solvent. In this case, an aminosilane represented by the following formula (X) can be introduced into the terminal of the polymer with the intention of improving adhesive properties to the substrate.

$$NH_2—R^9—SiR^{10}{}_{3-k}Y_k \quad (X)$$

wherein $R^9$ is —$(CH_2)_s$,

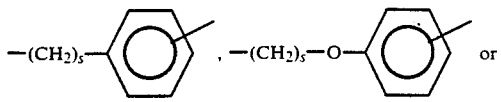

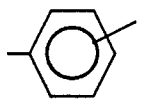

(wherein s is an integer of 1 to 4), $R^{10}$ is independently an alkyl group having 1 to 6 carbon atoms, a phenyl group or an alkyl-substituted phenyl group having 7 to 12 carbon atoms, Y is independently a hydrolytic alkoxy group, acetoxy group or a halogen, and k is a value of $1 \leq k \leq 3$.

Exemplary compounds of the aminosilane represented by the formula (X) are as follows:

Aminomethyl-di-n-propoxy-methylsilane, (β-aminoethyl)-di-n-propoxy-methylsilane, (β-aminoethyl)-diethoxy-phenylsilane, (β-aminoethyl)-tri-n-propoxysilane, (β-aminoethyl)-dimethoxy-methylsilane, (γ-aminoethyl)-di-n-propoxy-methylsilane, (γ-aminopropyl)-di-n-butoxy-methylsilane, (γ-aminopropyl)-trimethoxysilane, (γ-aminopropyl)-trimethoxysilane, (γ-aminopropyl)-di-n-pentoxy-phenylsilane, (γ-aminopropyl)-methoxy-n-propoxy-melthylsilane, (δ-aminobutyl)-dimethoxy-methylsilane, (3-aminophenyl)-di-n-propoxy-methylsilane, (4-aminophenyl)-tri-n-propoxysilane, [β-(4-aminophenyl)-ethyl]-diethoxy-methylsilane, [β-(3-aminophenyl)-ethyl]-di-n-propoxy-phenylsilane, [γ-(4-aminophenyl)-propyl]-di-n-propoxy-methylsilane, [γ-(4-aminophenoxy)-propyl]-di-n-propoxy-methylsilane, [γ-(3-aminophenoxy)-propyl]-di-n-butoxy-methylsilane, (γ-aminopropyl)-methyl-dimethoxysilane, (γ-aminopropyl)-methyl-diethoxysilane, (γ-aminopropyl)-ethyl-di-n-propoxysilane, 4-aminophenyl-trimethoxysilane, 3-aminophenyltrimethoxysilane, 4-aminophenyl-methyl-di-methoxysilane, 3-aminophenyl-di-methyl-methoxysilane and 4-aminophenyl-triethoxysilane.

In addition, with the intention of controlling the molecular weight of the poly(amide)amic acid, a monofunctional acid anhydride or an amine is used at the time of the reaction. Exemplary compounds of the monofunctional acid anhydride or the amine include phthalic anhydride, maleic anhydride, aniline and monoallylamine.

The thus synthesized poly(amide)amic acid can be easily converted into a poly(amide)isoimide by, for example, a dehydrating agent such as N,N'-dicyclohexylcarbodiimide or trifluoroacetic anhydride in accordance with the method described in the above-mentioned "Proceeding of Second International Conference on Polyimides". In this case, an imide group is formed sometimes, depending upon reaction conditions. The reaction proceeds as follows:

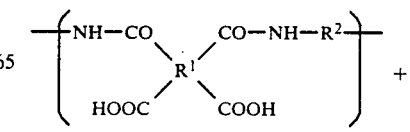

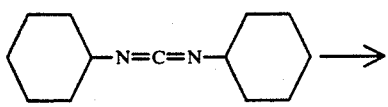

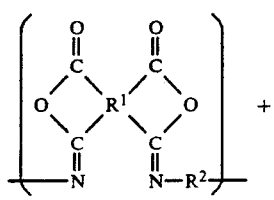

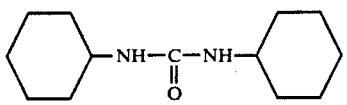

The reaction of N,N'-dicyclohexylcabodiimide as the dehydrating agent with the polyamic acid is shown hereinbefore, but it is not always necessary that all of amic acid is converted into the isoimide. However, when the ratio of the isoimide in the polymer decreases, the ratio of the photosensitive group to be added also decreases, with the result that the sensitivity of the polymer deteriorates. In consequence, it is preferable that the conversion of amic acid into the isoimide is accomplished as much as possible.

Next, the thiol group-containing amine represented by the formula (V) and, if necessary, the photosensitive unsaturated group-containing amine represented by the formula (VI) are added to this poly(amide)isoimide, and reaction is performed therebetween in the presence of the reaction solvent. It is preferred that the total amount of the amines to be added is nearly equimolar with that of the isoimide, though it may be more than or less than the equimolar level. Reaction temperature is in the range of 0° to 100° C., preferably about 10° to 30° C. Reaction time is in the range of 0.2 to 30 hours, preferably about 1 to 10 hours.

In this way, the photosensitive polymer of the present invention can be obtained which contains the repeating unit represented by the general formula (I) and contains or does not contain the repeating unit represented by the general formula (II). The inherent viscosity of this polymer is preferably in the range of 0.1 to 5 dl/g from the viewpoint of film formation properties. This inherent viscosity ($\eta_{inh}$) can be represented by the formula $$\eta_{inh} = (\ln \eta / \eta_o)/C$$

wherein $\eta$ is a viscosity of the polymer which is measured at a temperature of 30°±0.01° C. at a concentration of 0.5 g/dl in a solvent by the use of Ubbelohde's viscometer, $\eta_o$ is a viscosity of the same solvent at the same temperature by the same viscometer, and C is a concentration of the polymer, i.e., 0.5 g/dl.

The photosensitive polymer of the present invention can be stored in the state of a solution, and it can be also stored likewise in the solid state of powder or masses which are prepared by adding the polymer solution to a great deal of a non-solvent so as to deposit the polymer, and then filtering and drying the deposited polymer.

The photosensitive polymer composition of the present invention is composed of the above-mentioned components (a), (b), (c) and (d).

The photosensitive polymer (a) contains the repeating unit represented by the general formula (I), but this repeating unit need not occupy 100% ofaall the repeating units. However, in practice, it is preferred that the repeating unit of the general formula (I) is present in a ratio of 5% or more of all the repeating units. The repeating unit represented by the general formula (II) is preferably present in a ratio of 0 to 70%. The repeating units other than the repeating units represented by the general formulae (I) and (II) are not particularly limited, but they practically comprise one or more kinds of the following repeating units.

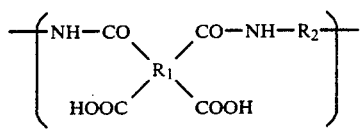

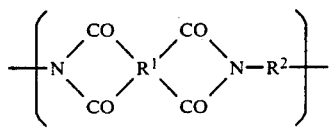

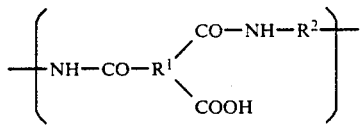

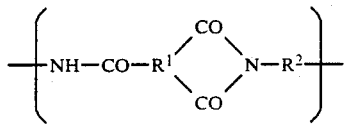

The concentration of the photosensitive polymer in the polymer composition solution is in the range of 2 to 50% by weight, preferably 10 to 30% by weight.

Exemplary compounds of the above-mentioned photopolymerization initiator and sensitizer (b) are as follows:

Benzoin, benzoin ether, benzophenone, p,p'-dimethyl benzophenone, 4,4'-bis(diethylamino benzophenone), Michler's ketone, 2-nitrofluorene, 5-nitroacenaphthene, 4-nitro-1-naphthylamine, anthrone, 1,9-benzanthrone, dibenzal acetone, anthraquinone, 2-methylanthraquinone, 1-nitropyrene, 1,8-dinitropyrene, pyrene-1,6-quinone, cyanoacridine, benzoquinone, 1,2-naphthoquinone, 1,4-naphthoquinone and 1,2-benzanthraquinone.

These compounds may be used singly or in combination.

The amount of the photopolymerization initiator or sensitizer is in the range of 0 to 20% by weight, preferably 0 to 10% by weight based on the photosensitive polymer.

Examples of the above-mentioned diazide compound (c) include 2,6-di(p-azidobenzal)-4-methylcyclohexanone, 2,6-di(p-azidobenzal)cyclohexanone, 4,4'-diazidochalcone, 4,4'-diazidobenzal acetone, 4,4'-diazidostilbene, 4,4'-diazido benzophenone, 4,4'-diazidodiphenylmethane and 4,4'-diazidodiphenylamine.

These diazide compounds may be used singly or in combination.

The amount of the diazide compound is in the range of 0 to 50% by weight, preferably 0 to 20% by weight based on the photosensitive polymer.

Examples of the above-mentoned compound (d) having the carbon-carbon double bond are as follows:

Butyl acrylate, cyclohexyl acrylate, dimethylaminoethyl methacrylate, benzyl acrylate, Carbitol acrylate, 2-ethylhexyl acrylate, 2-ethylhexyl methacrylate, lauryl methacrylate, 2-hydroxyethyl acrylate, 2-hydroxyethyl methacrylate, 2-hydroxypropyl acrylate, 2-hydroxypropyl methacylate, glycidyl methacrylate, N-methylolacrylamide, N-diacetoneacrylamide, N,N'-methylenebisacrylamide, N-vinylpyrrolidone, ethylene glycol diacrylate, diethylene glycol diacrylate, triethylene glycol diacrylate, butylene glycol diacrylate, butylene glycol dimethacrylate, neopentyl glycol diacrylate, neopentyl glycol dimethacrylate, 1,4-butanediol diacrylate, 1,6-hexanediol diacrylate, 1,6-hexanediol dimethacrylate, pentaerythritol diacrylate, pentaerythritol triacrylate, trimethylolpropane triacrylate and trimethylolpropane trimethacrylate.

These compounds may be used singly or in combination.

The amount of the compound (d) having the carbon-carbon double bond is in the range of 0 to 10% by weight, preferably 0 to 5% by weight based on the photosensitive polymer.

In the present invention, secondary materials such as a crosslinking agent, a dye and a pigment can be additionally used. The crosslinking agent is, for example, a known polyvalent thiol such as pentaerythritol tetra(3-mercapto propionate) or pentaerythritol tetra(mercapto acetate), and it is used in an amount of 10% by weight or less based on the photosensitive polymer.

The photosensitive polymer composition of the present invention can be obtained by dissolving the compounds (a), (b), (c) and (d) in the above-mentioned reaction solvent in the aforesaid ratio.

Next, reference will be made to a method for forming a patterned poly(amide)imide film by the use of the polymer composition of the present invention.

The polymer composition of the present invention can be applied onto a substrate such as a silicone wafer, a metallic plate, a plastic plate or a glass plate in accordance with a known means such as spin coating, immersion or spray printing. The coating film on the substrate is then prebaked at a temperature of 30° to 150° C. for a period of several minutes to several tens minutes by the use of a heating means such as an electric furnace or a hot plate so as to remove most of the solvent therefrom. Afterward, a negative mask is put on the coating film, and the latter is then irradiated with chemical rays through the mask. Examples of the chemical rays include X-rays, electron beams, ultraviolet rays, far ultraviolet rays and visible light, and above all, the ultraviolet rays and the far ultraviolet rays are particularly preferable. Then, the unexposed portions of the film are dissolved in and removed by a developing solution therefrom, thereby obtaining a relief pattern. The developing solution can be selected from the above-mentioned reaction solvents, and a mixture of the solvent and a lower alcohol such as methanol, ethanol or propanol which is the non-solvent for the photosensitive polymer of the present invention may be also used as the developing solution. If desired, the relief pattern is rinsed with the above-mentioned non-solvent, and if desired, it is further dried at a temperature of 150° C. or less, whereby the relief pattern can be stabilized.

Moreover, the coating film can be peeled from the substrate at an optional step after the prebaking process, and it can be used as a single film. The polymer of the relief pattern formed by the development is in the form of a precursor, and therefore it is then heated at a temperature of 200° to 500° C., preferably 300° to 400° C. for a period of several tens minutes to several hours, so that the patterned poly(amide)imide film is formed. In this case, chemical reaction makes progress as follows:

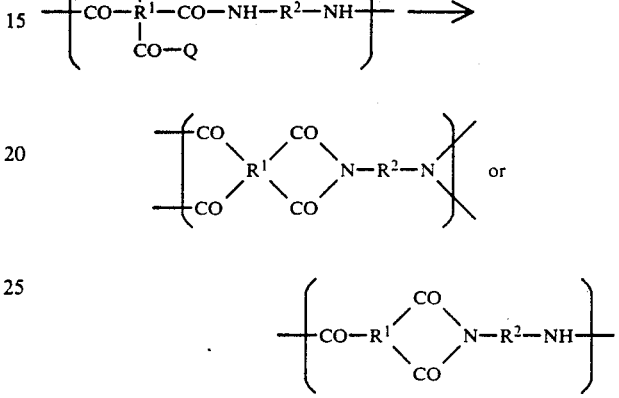

wherein Q is the crosslinked photosensitive component.

In the above reaction, the photosensitive component thermally decomposes and volatilizes.

In this way, the patterned heat-resistant poly(amide)imide film can be obtained from the photosensitive polymer of the present invention.

The novel photosensitive polymer of the present invention can be easily prepared by the manufacturing process of the present invention. Furtheremore, the photosensitive polymer composition of the present invention, i.e., the solution in which suitable additives are dissolved in a solvent has practically sufficient sensitivity and permits forming a good pattern. Moreover, the photosensitive polymer composition of the present invention is excellent in shelf stability, and so the thickness of the film prepared therefrom scarcely changes with time.

The photosensitive polymer of the present invention is applicable as electronic materials, particularly as materials for passivation films of semiconductors, print circuits and the like.

EXAMPLES

The present invention will be described in detail in reference to examples, but the scope of the present invention should not be limited by these examples.

In the first place, preparation examples of poly(amide)isoimides which will be used in the respective examples will be described as reference examples.

REFERENCE EXAMPLE 1

A 1-liter flask equipped with a stirrer, a dropping funnel, a thermometer, a condenser and a nitrogen-replacing device was fixed to a thermostatic chamber. In this flask were placed 500 g of dehydrated and purified N-methyl-2-pyrrolidone (hereinafter referred to simply as NMP), 60.39 g (0.302 mol) of 4,4'-diaminodiphenyl ether (hereinafter referred to simply as DDE) and 2.46 g (0.0431 mol) of monoallylamine, and the solution was stirred to dissolve the components in NMP. Afterward, to the solution was added 104.13 g (0.323 mol) of 3,3',4,4'-benzophenonetetracarboxylic dianhydride (hereinafter referred to simply as BTDA), and reaction was performed at a temperature of 20° to 30° C. for 10 hours, thereby obtaining a polyamic acid, to a terminal of which monoallyamine was added. To this solution was further added 133.27 g (0.646 mol) of N,N'-dicyclohexylcarbodiimide (hereinafter referred to simply as DCC), and the reaction was further performed at this temperature for 10 hours, whereby white N,N'-dicyclohexyl urea was deposited. The thus deposited white precipitate was removed therefrom by filtration, and the resulting filtrate was added dropwise to a great deal of acetone, so that a polyisoimide was deposited. This product was collected by filtration and dried overnight at 50° C. under reduced pressure, thereby isolating the polyisoimide.

REFERENCE EXAMPLE 2

By the use of the same procedure and devices as in Reference Example 1, 64.89 g (0.150 mol) of bis[4-(4-aminophenoxy)phenyl]sulfone was dissolved in 500 g of N,N-dimethylacetamide, and 53.71 g (0.167 mol) of BTDA was added thereto and reaction was then performed at 15° to 20° C. for 8 hours. Afterward, 6.40 g (0.0300 mol) of 4-aminophenyl-trimethoxysilane was added thereto, and the reaction was further carried out for 3 hours, so that a polyamic acid, to a terminal of which silane was added, was obtained. To this solution was added 70 g (0.339 mol) of DCC, and the reaction was performed at a temperature of 30° to 40° C. for 10 hours, so that white N,N'-dicyclohexyl urea was deposited. The thus deposited white precipitate was then removed therefrom by filtration, and the resulting filtrate was treated in the same manner as in Reference Example 1, thereby isolating a polyisoimide.

REFERENCE EXAMPLE 3

By the use of the same procedure and devices as in Reference Example 1, 83.82 g (0.388 mol) of 4,4'-diamino-diphenyl sulfide was dissolved in 500 g of NMP, and 67.61 g (0.310 mol) of pyromellitic dianhydride was added thereto and reaction was then performed at 15° to 20° C. for 5 hours. Afterward, 15.20 g (0.155 mol) of maleic anhydride was added thereto, and the reaction was further carried out for 5 hours, so that a polyamic acid, to a terminal of which maleic anhydride was added, was obtained. To this solution was added 123.78 g (0.600 mol) of DCC, and the reaction was performed at a temperature of 30° to 40° C. for 10 hours, so that white N,N'-dicyclohexyl urea was deposited. The thus deposited white precipitate was then removed therefrom by filtration, and the resulting filtrate was treated in the same manner as in Reference Example 1, thereby isolating a polyisoimide in which a part of the polyamic acid was converted into an isoimide.

REFERENCE EXAMPLE 4

By the use of the same procedure and devices as in Reference Example 1, 63.79 g (0.319 mol) of DDE was dissolved in 500 g of NMP, and 61.21 g (0.319 mol) of trimellitic anhydride was added thereto and reaction was then performed at 20° to 30° C. for 5 hours in order to form an addition product. Afterward, 131.62 g (0.638 mol) of DCC was further added thereto, and the reaction was further carried out for 20 hours, so that the conversion of amic acid into an isoimide and the condensation of the terminal amino group and a carboxyl group were simultaneously achieved in order to obtain a solution containing a polyamideisoimide. Deposited N,N'-dicyclohexyl urea was then removed from this solution by filtration, and the resulting filtrate was treated in the same manner as in Reference Example 1, thereby isolating a polyamideisoimide.

REFERENCE EXAMPLE 5

By the use of the same procedure and devices as in Reference Example 1, 33.89 g (0.0813 mol) of 2,2-bis[4-(4-aminophenoxy)phenyl]propane and 39.23 g (0.0813 mol) of 2,2-bis[4-(4-aminophenoxy)phenyl]hexafluoropropane were dissolved in 500 g of NMP, and 52.40 g (0.163 mol) of BTDA was further added thereto and reaction was then performed at 10° to 15° C. for 10 hours in order to form a polyamic acid. Afterward, 67.25 g (0.326 mol) of DCC was added to this polyamic acid solution, and the reaction was further carried out at this temperature for 15 hours, so that white N,N'-dicyclohexyl urea was deposited. This white precipitate was removed from the solution by filtration, and the resulting filtrate was then treated in the same manner as in Reference Example 1, thereby isolating a polyisoimide.

REFERENCE EXAMPLE 6

By the use of the same procedure and devices as in Reference Example 1, 53.64 g (0.184 mol) of 1,3-bis(4-aminophenoxy)benzene and 2.40 g (0.00966 mol) of 1,3-bis(3-aminopropyl)tetramethyldisiloxane were dissolved in 500 g of NMP, and 69.15 g (0.193 mol) of diphenylsulfone-3,3',4,4'-tetracarboxylic dianhydride was further added thereto and reaction was then performed at 20° to 30° C. for 10 hours in order to form a polyamic acid. Afterward, 79.63 g (0.386 mol) of DCC was added to this polyamic acid solution, and the reaction was further carried out at this temperature for 20 hours, so that white N,N'-dicyclohexyl urea was deposited. This white precipitate was removed from the solution by filtration, and the resulting filtrate was then treated in the same manner as in Reference Example 1, thereby isolating a polyisoimide.

EXAMPLE 1

A 200-milliliter flask equipped with a stirrer, a dropping funnel, a thermometer, a condenser and a nitrogen-replacing device was fixed to a thermostatic chamber. In this flask were placed 50 g of dehydrated and purified NMP, 50 g of $\gamma$-butyrolactone and 20 g of the polyisoimide synthesized in Reference Example 1, and the solution was stirred to dissolve the components in NMP. To the solution were further added 1.63 g (0.0211 mol) of aminoethanethiol and 6.14 g (0.0632 mol) of diallylamine, and reaction was performed at a temperature of 40° to 50° C. for 5 hours. The resulting reaction solution was added dropwise to a great deal of acetone, so that a photosensitive polymer of the present invention was deposited. The thus deposited precipitate was collected by filtration and was then dried overnight at 50° C. under reduced pressure, thereby isolating the polymer.

The thus obtained polymer of the present invention had an inherent viscosity of 1.35 dl/g in NMP. The infrared absorption spectrum of this polymer is shown in FIG. 1. The measurement of this infrared absorption spectrum was made for the polymer having the form of a film. In FIG. 1, it was observed that the absorption based on a thiol group was present in the vicinity of 2,500 cm$^{-1}$ and the strong absorption based on an amido group and an allyl group was present in the range of 1,600 to 1,700 cm$^{-1}$.

EXAMPLE 2

By the use of the same procedure and devices in Example 1, 20 g of the polyisoimide synthesized in Reference Example 2 was added to 100 g of NMP, and the solution was then stirred to dissolve the polyisoimide therein. To this solution was added 2.25 g (0.0292 mol) of aminoethanethiol, and reaction was then performed at a temperature of 20° to 30° C. for 12 hours. Afterward, the reaction solution was treated in the same manner as in Example 1, thereby isolating a photosensitive polymer of the present invention. This polymer had an inherent viscosity of 0.72 dl/g in NMP.

EXAMPLE 3

By the use of the same procedure and devices in Example 1, 20 g of the polyisoimide synthesized in Reference Example 3 was added to 100 g of NMP, and the solution was then stirred to dissolve the polyisoimide therein. To this solution were further added 0.781 g (0.0101 mol) of aminoethanethiol and 5.20 g (0.0912 mol) of allylamine, and reaction was then performed at a temperature of 15° to 20° C. for 20 hours. Afterward, the reaction solution was treated in the same manner as in Example 1, thereby isolating a photosensitive polymer of the present invention.

This polymer had an inherent viscosity of 0.58 dl/g in NMP.

EXAMPLE 4

By the use of the same procedure and devices in Example 1, 20 g of the polyisoimide synthesized in Reference Example 4 was added to 100 g of NMP, and the solution was then stirred to dissolve the polyisoimide therein. To this solution were further added 0.865 g (0.0112 mol) of aminoethanethiol and 2.18 g (0.224 mol) of diallylamine, and reaction was then performed at a temperature of 10° to 15° C. for 5 hours and further at 50° C. for 2 hours. Afterward, the reaction solution was treated in the same manner as in Example 1, thereby isolating a photosensitive polymer of the present invention.

This polymer had an inherent viscosity of 0.47 dl/g in NMP.

EXAMPLE 5

By the use of the same procedure and devices in Example 1, 20 g of the polyisoimide synthesized in Reference Example 5 was added to 100 g of NMP, and the solution was then stirred to dissolve the polyisoimide therein. To this solution were further added 1.47 g (0.0191 mol) of aminoethanethiol and 3.71 g (0.0382 mol) of diallylamine, and reaction was then performed at a temperature of 30° to 40° C. for 8 hours. Afterward, the reaction solution was treated in the same manner as in Example 1, thereby isolating a photosensitive polymer of the present invention.

This polymer had an inherent viscosity of 1.85 dl/g in NMP.

EXAMPLE 6

By the use of the same procedure and devices in Example 1, 20 g of the polyisoimide synthesized in Reference Example 6 was added to 100 g of NMP, and the solution was then stirred to dissolve the polyisoimide therein. To this solution were further added 0.524 g (0.00679 mol) of aminoethanethiol and 5.94 g (0.0611 mol) of diallylamine, and reaction was then performed at a temperature of 30° to 40° C. for 10 hours. Afterward, the reaction solution was treated in the same manner as in Example 1, thereby isolating a photosensitive polymer of the present invention.

This polymer had an inherent viscosity of 1.07 dl/g in NMP.

EXAMPLE 7

In 25.5 g of NMP was dissolved 4.5 g of each of the photosensitive polymers of the present invention synthesized in Examples 1 to 6, and to the solution were further added a photopolymerization initiator or a sensitizer, a diazide compound and a compound having a carbon-carbon double bond, as needed, so as to prepare a photosensitive polymer composition of the present invention. Next, this composition was applied onto a silicone wafer by spin coating, and was then prebaked in order to form a uniform coating film thereon. Afterward, the coating film was irradiated with an ultra-high voltage mercury vapor lamp (20 mW/cm$^2$), irradiation time being varied. The irradiated film was then immersed in a mixed solution of 4 volumes of NMP and 1 volume of ethyl alcohol to develop the film, and the developed coating film was then rinsed in ethyl alcohol, followed by drying, thereby obtaining a sharp relief pattern.

Figure 2:
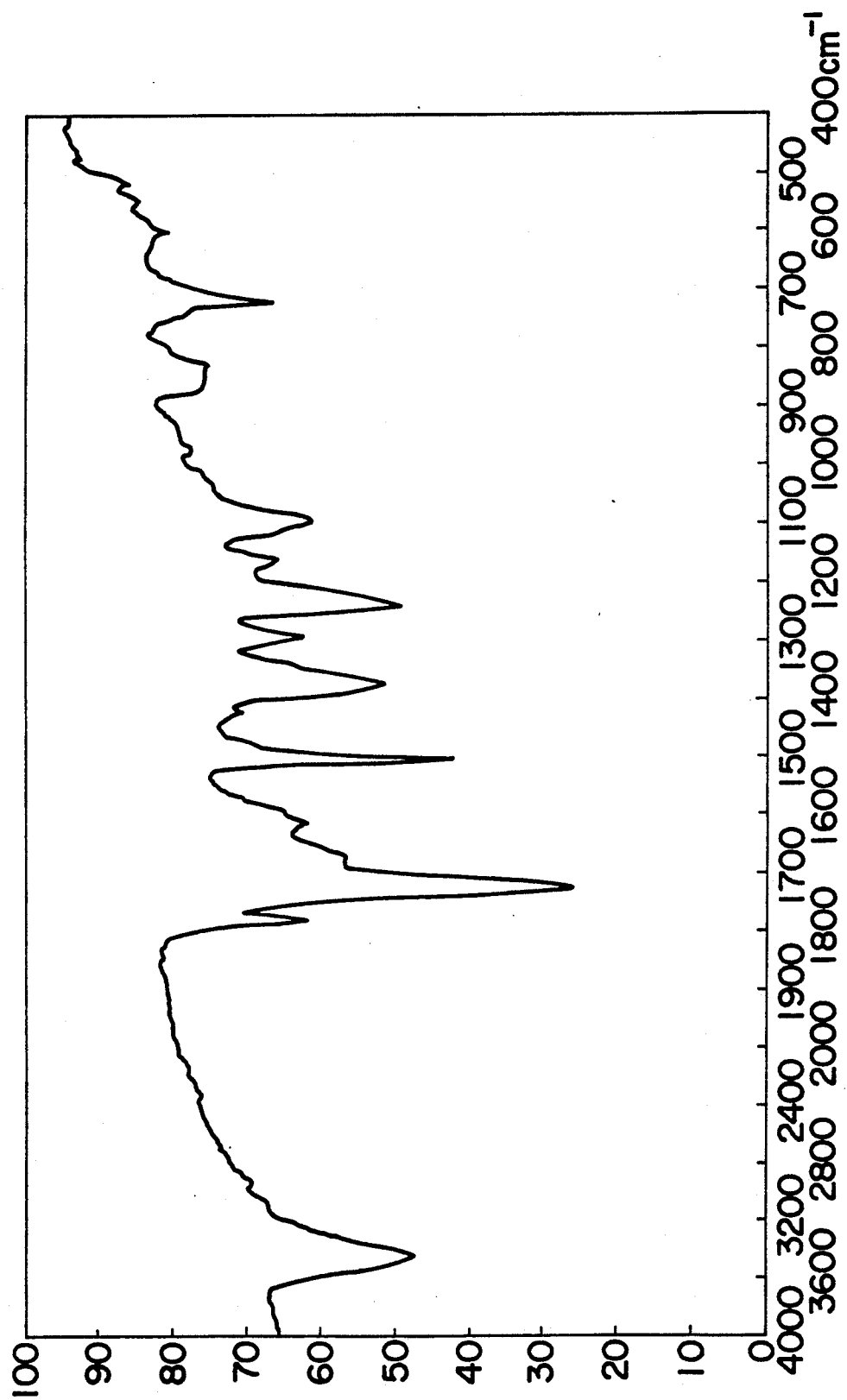
FIG. 2 is the infrared absorption spectrum of the polymer prepared in Example 7-1 in Table 1. The absorptions based on a thiol group, an amido group and an allyl group vanished and the strong absorption based on an imido group was present at 1,780 and 720 cm$^{-1}$.

Sensitivity was defined as an exposure required until a ratio of a remaining film thickness to an application film thickness became 0.5. The thus obtained relief pattern was then baked at 200° C. for 30 minutes and further at 350° C. for 1 hour in an electric furnace, but at this time, the pattern did not break. According to infrared absorption spectrum of the baked polymer by a KBr tablet method, it was confirmed that after the baking, all the photosensitive polymers were converted into poly(amide)imide. The infrared absorption spectrum of the polymer prepared in Example 7-1 in Table 1 which will be described hereinafter is shown in FIG. 2. In this figure, it was observed that the absorptions based on a thiol group, an amido group and an allyl group vanished and the strong absorption based on an imido group was present at 1,780 and 720 cm$^{-1}$.

Furthermore, in order to inspect the stability with time of the photosensitive polymers of the present invention, the change in rotation viscosities with time of each solution was measured. Here, the rotation viscosity referred to above is a viscosity measured at a temperature of 25° C. by the use of an E-type viscometer (made by Tokyo Keiki Co., Ltd.; trade mark VISCONIC EMD). The measured rotation viscosities of the photosensitive compositions in the respective examples are set forth in detail in Table 1.

COMPARATIVE EXAMPLE 1

By the use of the same procedure and devices as in Example 1, a polyamic acid solution having an inherent viscosity of 1.1 dl/g was synthesized from 100 g of NMP, 12.34 g (0.0383 mol) of BTDA and 7.66 g (0.0383 mol) of DDE. To this solution was added 14.19 g (0.0766 mol) of dimethylaminoethyl methacrylate in order to prepare a photosensitive polymer solution. Afterward, 30 g of this solution was sampled, and additives shown in Table 1 were added to the sampled solution. Next, a photosensitive test was made in the same manner as in Example 7. The results are set forth in Table 1.

(IV) with an amine containing a thiol group represented by the general formula (V) and, if necessary, an amine containing a photosensitive unsaturated group repre-

TABLE 1

| | Photosensitive Polymer | Initiator or Sensitizer | Diazide Compound | Compound Having Carbon—Carbon Double Bond | Sensitivity (film thickness) | Rotation Viscosity (cps) (after 1 month)/ (just after preparation) |
|---|---|---|---|---|---|---|
| Example 7-1 | Polymer in Example 1 | Michler's ketone 0.35 g | — | — | 460 mJ/cm$^2$ (4.8 μm) | 1980/1880 |
| Example 7-2 | " | Michler'ketone 0.35 g | A-1*$^1$ 0.65 g | M-1*$^2$ 0.2 g | 35 mJ/cm$^2$ (4.8 μm) | 1950/1840 |
| Example 7-3 | Polymer in Example 2 | Benzanthrone 0.6 g | A-1 0.2 g | — | 72 mJ/cm$^2$ (3.6 μm) | 845/770 |
| Example 7-4 | Polymer in Example 3 | 2-Nitrofluorene 0.6 g | A-1 0.5 g | — | 43 mJ/cm$^2$ (3.3 μm) | 578/560 |
| Example 7-5 | Polymer in Example 4 | Benzanthrone 0.6 g | A-1 0.4 g | — | 88 mJ/cm$^2$ (3.1 μm) | 430/410 |
| Example 7-6 | Polymer in Example 5 | 5-Nitroace- naphthene 0.3 g | A-1 0.2 g | M-2*$^4$ 0.3 g | 63 mJ/cm$^2$ (5.5 μm) | 2930/2710 |
| Example 7-7 | Polymer in Example 6 | 1-Nitropyrene 0.4 g | A-2*$^3$ 0.3 g | — | 61 mJ/cm$^2$ (4.0 μm) | 1170/1130 |
| Comp. Ex. 1 | Polymer in Comp. Ex. 1 | Michler's ketone 0.45 g | — | — | 4600 mJ/cm$^2$ (4.2 μm) | 420/1220 |

*$^1$A-1: 2,6-Di(p-azidobenzal)-4-methylcyclohexanone
*$^2$A-2: 2,6-Di(p-azidobenzal)cyclohexanone
*$^3$M-1: Trimethylolpropane trimethacrylate
*$^4$M-2: Pentaerythritol triacrylate

What is claimed is:

1. A photosensitive polymer having an inherent viscosity of 0.1 to 5 dl/g when measured in a solvent at a temperature of 30°±0.01° C. at a concentration of 0.5 g/dl, containing a repeating unit represented by the following general formula (I), and containing or not containing a repeating unit represented by the following general formula (II):

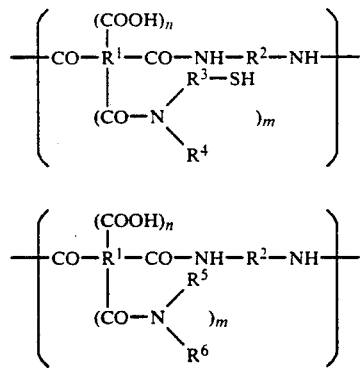

wherein R$^1$ is independently a trivalent or tetravalent carbon cyclic aromatic group or hetrocyclic group; R$^2$ is independently an aliphatic group having at least 2 carbon atoms, an alicyclic group, an aromatic aliphatic group, a carbon cyclic aromatic group, a heterocyclic group or a polysiloxane group; R$^3$ is a divalent organic group; R$^4$ is —R$^3$—SH, a hydrogen atom or a monovalent organic group; R$^5$ is a monovalent organic group having a photosensitive unsaturated group; R$^6$ is a hydrogen atom or a monovalent organic group; m is independently 1 or 2; n is independently 0 or 1; and m and n satisfy 1≦m +n≦2.

2. A process for manufacturing a photosensitive polymer which comprsises the step of reacting a poly(amide)isoimide containing either or both of a repeating unit represented by the general formula (III) and a repeating unit represented by the general formula (IV) with an amine containing a thiol group represented by the general formula (V) and, if necessary, an amine containing a photosensitive unsaturated group represented by the general formula (VI) at a temperature of 0° to 100° C.:

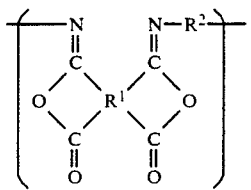

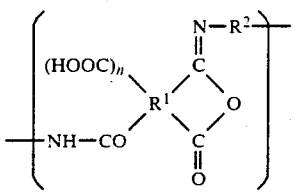

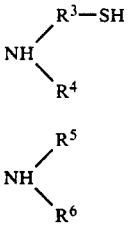

wherein R$^1$ is independently a trivalent or tetravalent carbon cyclic aromatic group or hetrocyclic group; R$^2$ is independently an aliphatic group having at least 2 carbon atoms, an alicyclic group, an aromatic aliphatic group, a carbon cyclic aromatic group, a heterocyclic group or a polysiloxane group; R$^3$ is a divalent organic group; R$^4$ is —R$^3$—SH, a hydrogen atom or a monovalent organic group; R$^5$ is a monovalent organic group having a photosensitive unsaturated group; R$^6$ is a hydrogen atom or a monovalent organic group; n is independently 0 or 1.

* * * * *